(12) United States Patent
Katayose et al.

(10) Patent No.: US 9,671,818 B2
(45) Date of Patent: Jun. 6, 2017

(54) MEMORY DEVICE

(71) Applicant: Kabushiki Kaisha Toshiba, Minato-ku (JP)

(72) Inventors: Hideo Katayose, Yokohama (JP); Keiji Hamoda, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 55 days.

(21) Appl. No.: 14/482,588

(22) Filed: Sep. 10, 2014

(65) Prior Publication Data

US 2015/0262665 A1    Sep. 17, 2015

Related U.S. Application Data

(60) Provisional application No. 61/951,744, filed on Mar. 12, 2014.

(51) Int. Cl.

| G06F 1/06 | (2006.01) |
|---|---|
| G11C 7/10 | (2006.01) |
| G11C 16/04 | (2006.01) |
| G11C 7/02 | (2006.01) |
| G11C 11/56 | (2006.01) |
| G06F 12/0804 | (2016.01) |
| G11C 13/00 | (2006.01) |
| G11C 16/30 | (2006.01) |
| G11C 16/32 | (2006.01) |

(52) U.S. Cl.
CPC .............. *G06F 1/06* (2013.01); *G11C 7/02* (2013.01); *G11C 7/1006* (2013.01); *G11C 16/0483* (2013.01); *G06F 12/0804* (2013.01); *G11C 11/5642* (2013.01); *G11C 13/0038* (2013.01); *G11C 13/0061* (2013.01); *G11C 16/30* (2013.01); *G11C 16/32* (2013.01)

(58) Field of Classification Search
CPC ........ G06F 1/06; G06F 13/16; G06F 12/0804; G11C 7/1006; G11C 16/0483; G11C 7/02; G11C 11/5642; G11C 16/32; G11C 16/30; G11C 13/0061; G11C 13/0038; G06K 19/07

See application file for complete search history.

(56) References Cited

U.S. PATENT DOCUMENTS

| 6,381,143 B1* | 4/2002 | Nakamura | ............... B29C 65/08 |
| | | | 235/492 |
| 6,407,449 B1 | 6/2002 | Takikawa et al. | |
| 8,021,928 B1* | 9/2011 | Cusack | ............. H01L 23/49575 |
| | | | 257/776 |
| 8,998,620 B2* | 4/2015 | Ni | ......................... H01R 12/71 |
| | | | 361/737 |

(Continued)

FOREIGN PATENT DOCUMENTS

| JP | 2000-299438 | 10/2000 |
| JP | 2006-121210 | 5/2006 |
| JP | 2011-91345 | 5/2011 |

*Primary Examiner* — Harry W Byrne
*Assistant Examiner* — Ajay Ojha
(74) *Attorney, Agent, or Firm* — Oblon, McClelland, Maier & Neustadt, L.L.P.

(57) ABSTRACT

According to one embodiment, a memory controller sends a periodic control signal from a first terminal on a non-volatile memory side to the non-volatile memory, and the control signal includes a data strobe signal, a write enable signal, and a read enable signal.

10 Claims, 6 Drawing Sheets

(56) References Cited

U.S. PATENT DOCUMENTS

| | | | |
|---|---|---|---|
| 2007/0255891 A1* | 11/2007 | Chow | G06F 12/0804 |
| | | | 711/103 |
| 2008/0286990 A1* | 11/2008 | Hiew | H01L 21/565 |
| | | | 439/55 |
| 2009/0296487 A1* | 12/2009 | Murin | G11C 11/5642 |
| | | | 365/185.21 |
| 2011/0095406 A1 | 4/2011 | Mukaibara | |
| 2013/0051162 A1* | 2/2013 | Amirkhany | G11C 7/1006 |
| | | | 365/189.011 |
| 2014/0003159 A1* | 1/2014 | Jung | G11C 16/0483 |
| | | | 365/185.29 |
| 2014/0264904 A1* | 9/2014 | Fai | H01L 23/49827 |
| | | | 257/774 |
| 2015/0049849 A1* | 2/2015 | Chen | G06F 1/06 |
| | | | 375/376 |

* cited by examiner

MEMORY DEVICE

CROSS-REFERENCE TO RELATED APPLICATIONS

This application is based upon and claims the benefit of priority from Provisional Patent Application No. 61/915744, filed on Mar. 12, 2014; the entire contents of which are incorporated herein by reference.

FIELD

Embodiments described herein relate generally to a memory device.

BACKGROUND

A USB (universal serial bus) memory device is formed by a USB controller and an NAND-type flash memory (hereinafter, referred to as NAND memory), and USB2.0 realizes a date rate of 480 Mbps (high speed), and USB3.0 realizes a data rate of 5 Gbps (super speed).

DETAILED DESCRIPTION

In general, according to one embodiment, a memory controller includes a first terminal arranged on a non-volatile memory side to send a periodic control signal from the first terminal to the non-volatile memory.

Exemplary embodiments of a memory device will be explained below in detail with reference to the accompanying drawings. The present invention is not limited to the following embodiments.
(First Embodiment)

Figure 1:
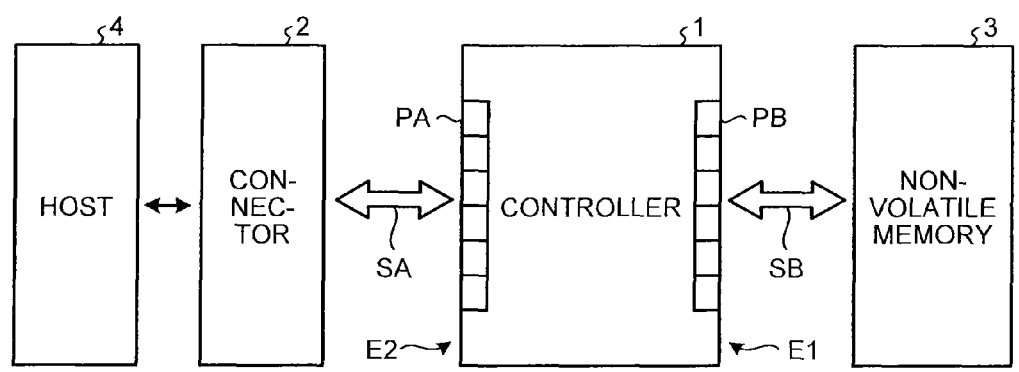
FIG. 1 is a schematic block diagram of a memory device according to a first embodiment.

FIG. 1 is a schematic block diagram of a memory device according to a first embodiment.

Referring to FIG. 1, the memory device is provided with a controller 1, a connector 2, and a non-volatile memory 3. Positional relationship among the controller 1, the connector 2, and the non-volatile memory 3 illustrated in FIG. 1 correspond to actual physical positional relationship among them in the actually implemented memory device. The memory device may be a portable memory device that is detachably attached to a host device, such as a USB memory device, a memory card including an SD card, or the like, for example. In addition, the memory device may be a memory device fixedly incorporated into a system product in conformity with standards for UFS (universal flash storage), eMMC™, or the like. Further, the memory device may be an SSD (solid state drive). The controller 1 controls the non-volatile memory 3. The connector 2 connects the controller 1 to a host 4. The non-volatile memory 3 may be an NAND memory, a ReRAM (resistance random access memory), a PCRAM (phase-change random access memory), an MRAM (magnetoresistive random access memory), or FeRAM (ferroelectric random access memory). The host 4 may be a personal computer, a mobile information terminal such as a smart phone, or a cloud computer. The controller 1, the connector 2 and the non-volatile memory 3 can be mounted on a mounting substrate.

In this example, a semiconductor chip with the controller 1 formed may be sealed with resin. Example of resin sealing includes QFP (quad flat package). Alternatively, the semiconductor chip with the controller 1 formed may be subjected to COB (chip on board) such that the semiconductor chip is placed directly and then sealed on a substrate on which the controller 1 and the non-volatile memory 3 are to be mounted.

In this example, the non-volatile memory 3 is placed on E1 side of the controller 1, and the connector 2 is placed on E2 side of the same opposite to the E1 side. A terminal PB is provided on the E1 side of the controller 1, and a terminal PA is provided on the E2 side of the controller 1. The terminals PA and PB may be pad electrodes of a semiconductor chip or pins in QFP package or the like.

When data is get or set, a periodic control signal SB is sent from the PB to the non-volatile memory 3. In addition, an interface signal SA for exchange with the host 4 is transmitted or received via the terminal PA. The periodic control signal SB includes a data strobe signal DQS, a write enable signal WE, and a read enable signal RE. In the case of a USB memory device, the interface signal SA includes differential data signal D− and D+ or differential reception signals SSRX− and SSRX+ and differential transmission signals SSTX− and SSTX+. The controller 1 can perform interactive communications with the host 4 by using the differential data signal D− and D+ or the differential reception signals SSRX− and SSRX+ and the differential transmission signals SSTX− and SSTX+.

In this example, by sending the periodic control signal SB from the terminal PB to the non-volatile memory 3, wire length for the control signal SB can be shortened. Accordingly, even when the control signal SB is higher in frequency, it is possible to suppress significant influence of the higher frequency on EMI because the wire for the control signal SB plays the role of an antenna.
(Second Embodiment)

Figure 2:
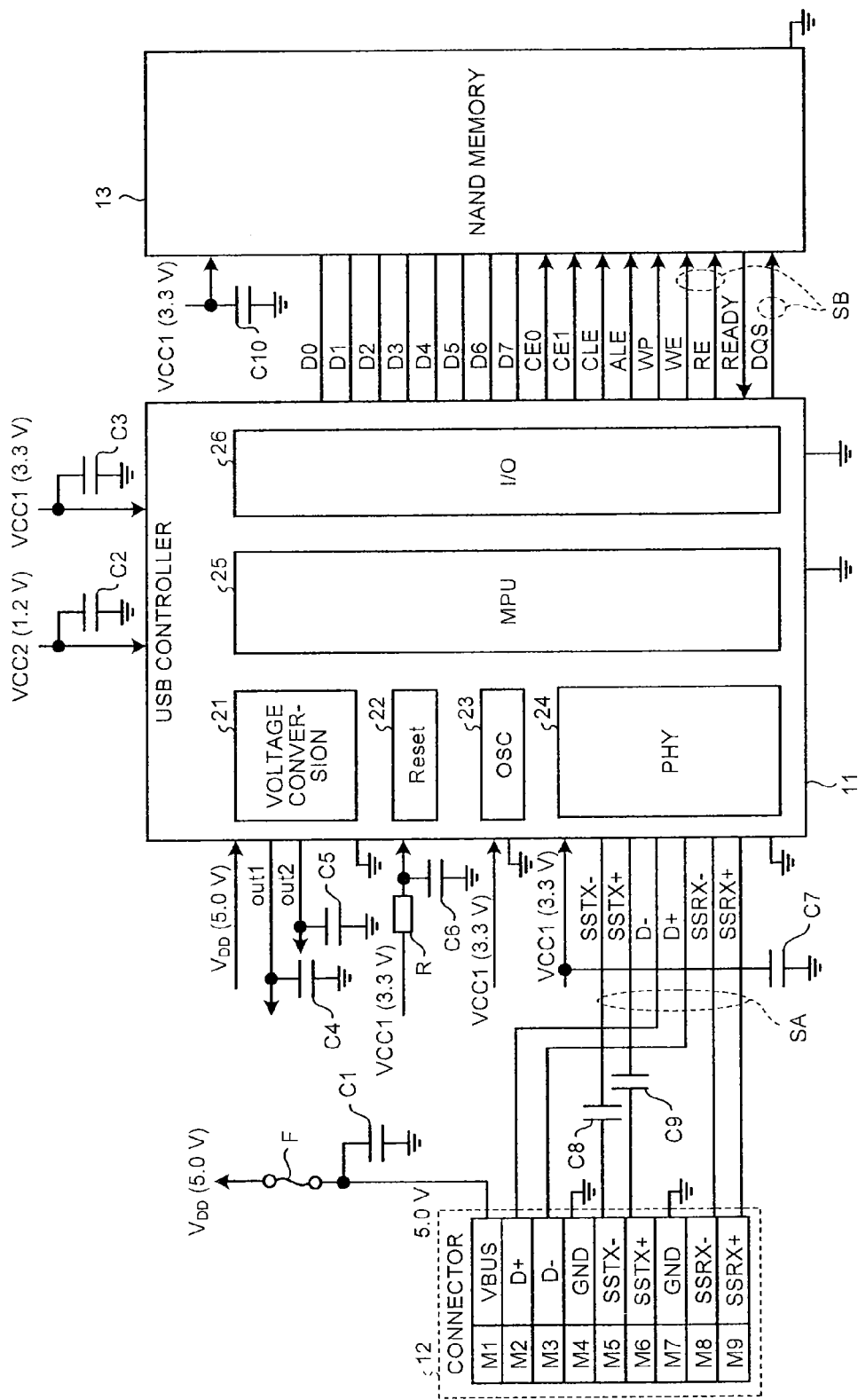
FIG. 2 is a schematic block diagram of a memory device according to a second embodiment.

FIG. 2 is a schematic block diagram of a memory device according to a second embodiment. In the second embodiment, the non-volatile memory 3 is an NAND memory, the controller 1 is a USB controller in conformity with USB3.0 standards.

Referring to FIG. 2, the memory device is provided with a USB controller 11, a connector 12, and an NAND memory 13. The USB controller 11 includes a voltage conversion unit 21, a reset unit (Reset) 22, an oscillator (OSC) 23, a data conversion unit (PHY) 24, an MPU 25, and an I/O unit 26. The USB controller 11 is supplied with a 5-V power-supply voltage VDD, and two power-supply voltages VCC1 and VCC2 of 3.3 V and 1.2 V. The USB controller 11 outputs two output voltages out1 and out2 of 3.3 V and 1.2 V. The USB controller 11 is externally provided with capacities C3 and C7 for stabilizing the power-supply voltage VCC1, a capacity C2 for stabilizing the power-supply voltage VCC2, a capacity C4 for stabilizing the output voltage out1, and a capacity C5 for stabilizing the output voltage out2. The USB controller 11 is also externally provided with a delay circuit including a resistor R and a capacity C6 for the power-supply voltage VCC1. The foregoing capacities C2 to C5 and C7 and the delay circuit may be eliminated. The voltage conversion unit 21 receives the power-supply voltage VDD and regulates the two power-supply voltages VCC1 and VCC2. The voltage conversion unit 21 may be eliminated when the power-supply voltages VCC1 and VCC2 are externally supplied. The reset unit 22 initializes the USB controller 11 including the MPU 25, and thus cancels a reset signal after the power-supply voltage VCC1 has sufficiently risen. An external terminal for resetting may be provided when the reset unit 22 is not embedded or external reset signals are to be used. The oscillator 23 has a PLL (phase locked loop) embedded therein to support a data rate of 5 Gbps (super speed) under USB3.0 and outputs a desired clock signal. The data conversion unit 24 conducts data conversion for communications with the host 4 via differential signals. The MPU 25 is an arithmetic processing unit that operates at the 1.2-V power-supply voltage VCC2 to support high-speed processing. The I/O unit 26 mediates data input and output with respect to the NAND memory 13. In this example, the MPU 25 communicates with the host 4 via the data conversion unit 24, and communicates with the NAND memory 13 via the I/O unit 26. In addition, the USB controller 11 mediates between the host on the end of the connector 12 not illustrated in FIG. 2 (host 4 illustrated in FIG. 1) and the NAND memory 13 to provide a storage area of the NAND memory 13 to the host.

The connector 12 is provided with pads M1 to M9. For example, the pad M1 can be assigned a power-supply voltage VBUS, the pads M2 and M3 can be assigned the differential data signals D+ and D−, the pads M4 and M7 can be assigned a ground potential GND, the pads M5 and M6 can be assigned the differential transmission signals SSTX− and SSTX+, and the pads M8 and M9 can be assigned the differential reception signals SSRX− and SSRX+. The power-supply voltage VDD supplied to the pad Ml is then supplied to the USB controller 11 and the like via a fuse F. The pad M1 is externally provided with a capacity C1 to stabilize the power-supply voltage VDD. The pads M2, M3, M8, and M9 are connected to the USB controller 11. The pads M5 and M6 are connected to the USB controller 11 via capacities C8 and C9, respectively.

The NAND memory 13 is supplied with the power-supply voltage VCC1. The NAND memory 13 is externally provided with a capacity C10 to stabilize the power-supply voltage VCC1. Exchanged between the USB controller 11 and the NAND memory 13 are data signals D0 to D7, chip enable signals CE0 and CE1, a command latch enable signal CLE, an address latch enable signal ALE, a write protect signal WP, a write enable signal WE, a read enable signal RE, a ready signal READY, and a data strobe signal DQS.

The foregoing fuse F is inserted for the purpose of overcurrent protection. Alternatively, another means may be provided for the same purpose or the fuse F may be eliminated when no overcurrent occurs.

Figure 3:
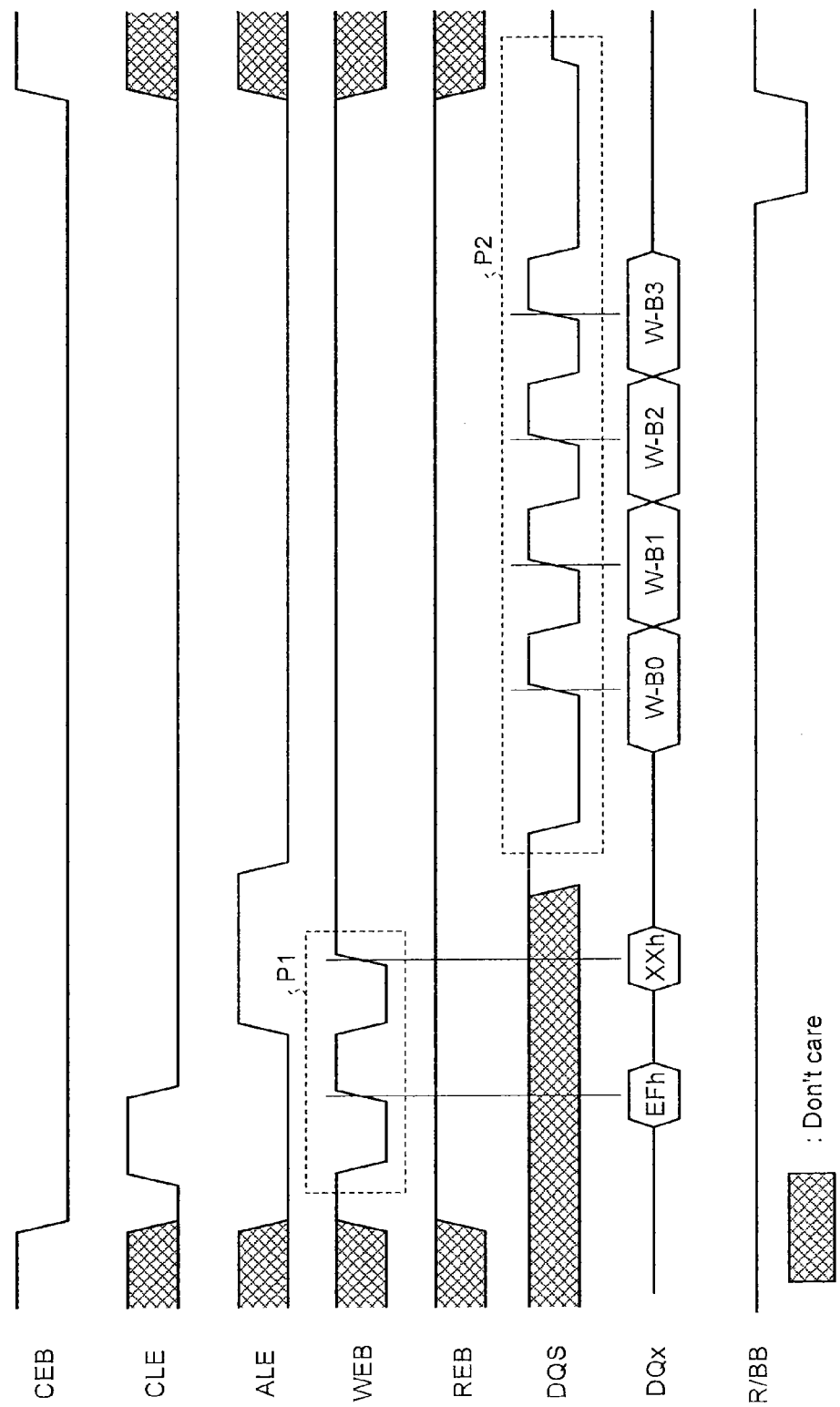
FIG. 3 is a diagram illustrating first examples of signal waveforms of an NAND memory illustrated in FIG. 2.

FIG. 3 is a diagram illustrating first examples of signal waveforms of the NAND memory illustrated in FIG. 2.

The chip enable signal CEB, the write enable signal WEB, the read enable signal REB, the address latch enable signal ALE, and the command latch enable signal CLE are control signals transmitted from the USB controller 11 to the NAND memory 13.

The chip enable signal CEB is a signal for selecting the NAND memory 13. The write enable signal WEB is a signal for capturing signals from a data bus DQx (data signals D0 to D7 illustrated in FIG. 2) into the NAND memory 13. The read enable signal REB is a signal for causing the NAND memory 13 to output signals to the data bus DQx. The last character "B" of CEB, WEB, and REB indicates that the enable state is achieved when the signal becomes L level.

The address latch enable signal ALE is a signal for controlling capturing of address data by the NAND memory 13. The NAND memory 13 recognizes as address signal a signal captured from the data bus DQx into the NAND memory 13 while the address latch enable signal ALE is asserted.

The command latch enable signal CLE is a signal for controlling capturing of a command (for example, a write command) by the NAND memory 13. The NAND memory 13 recognizes as a command a signal captured from the data bus DQx into the NAND memory 13 while the command latch enable signal CLE is asserted.

In addition, the NAND memory 13 recognizes as data a signal captured from the data bus DQx into the NAND memory 13 while the address latch enable signal ALE and the command latch enable signal CLE are not asserted.

The ready/busy signal R/BB (ready signal READY illustrated in FIG. 2) is a signal for the NAND memory 13 to notify the USB controller 11 that the NAND memory 13 is in the ready state or the busy state. The last character "B" of R/BB indicates that the NAND memory 13 is in the busy state when the signal becomes L level.

The data strobe signal DQS is a signal for controlling timings of transmission/reception of data on the data bus DQx. On transmission of data from the USB controller 11 to the NAND memory 13, the data strobe signal DQS is transmitted concurrently with the data from the USB controller 11, and the NAND memory 13 captures the data in synchronization with the data strobe signal DQS. Similarly, on transmission of data from the NAND memory 13 to the USB controller 11, the data strobe signal DQS is transmitted concurrently with the data from the NAND memory 13, the USB controller 11 captures the data in synchronization with the data strobe signal DQS.

Referring to FIG. 3, the chip enable signal CEB falls to select a chip as a target. Then, when the command latch enable signal CLE is in the risen state, the write enable signal WEB rises to latch a command. In addition, when the address latch enable signal ALE is in the risen state, the write enable signal WEB rises to latch an address. When the read enable signal REB is in the risen state, write data is input at the timing of rising of the data strobe signal DQS.

In this example, the write enable signal WEB has periodicity P1, and the data strobe signal DQS has periodicity P2.

Figure 4:
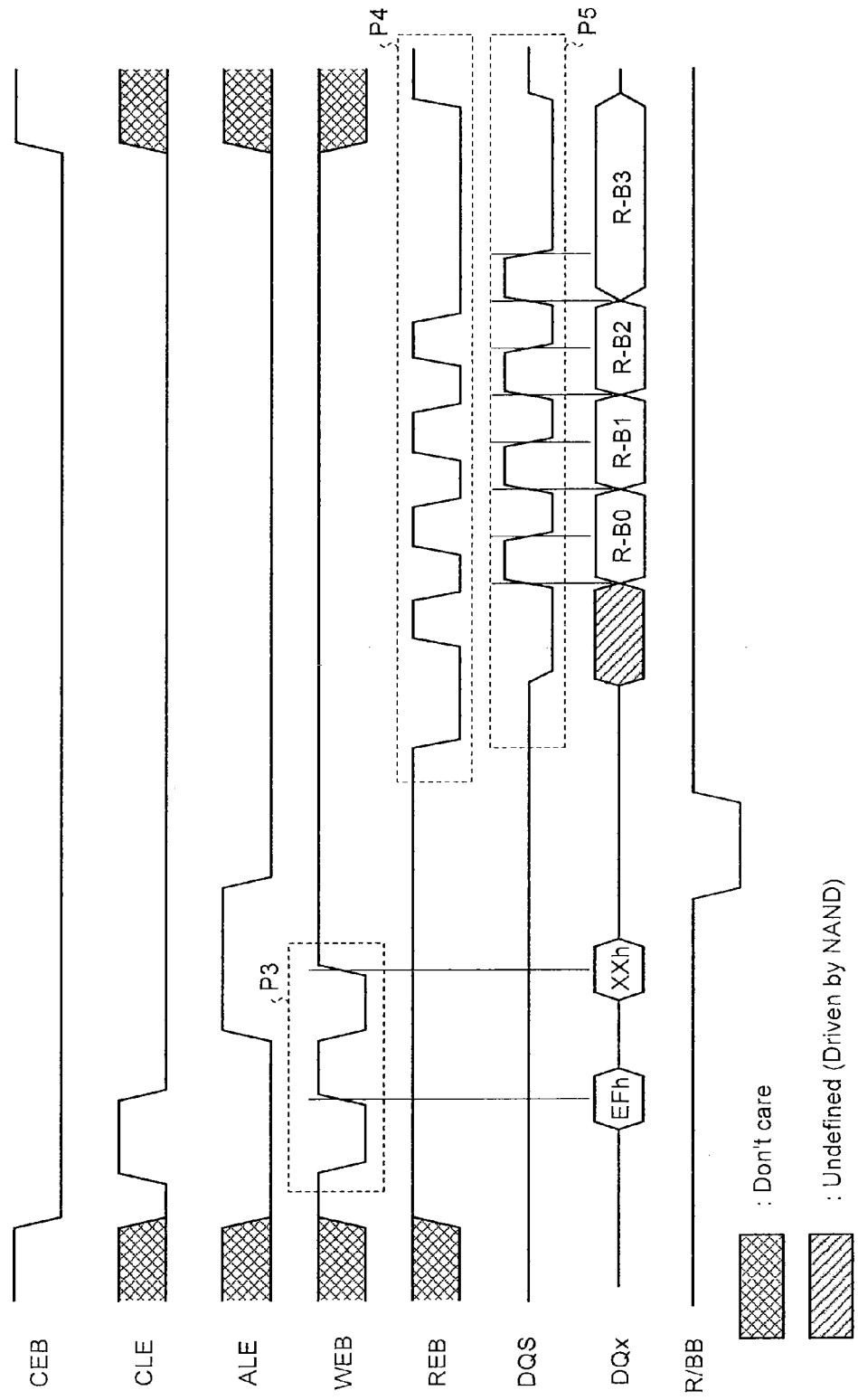
FIG. 4 is a diagram illustrating second examples of signal waveforms of the NAND memory illustrated in FIG. 2.

FIG. 4 is a diagram illustrating second examples of signal waveforms of the NAND memory illustrated in FIG. 2.

Referring to FIG. 4, the chip enable signal CEB falls to select a chip as a target. When the command latch enable signal CLE is in the risen state, the write enable signal WEB rises to latch a command. In addition, when the address latch enable signal ALE is in the risen state, the write enable signal WEB rises to latch an address. Then, according to the rising of the read enable signal REB, read data is output in synchronization with the data strobe signal DQS.

When the NAND memory 13 gets data, the write enable signal WEB has periodicity P3, and the read enable signal REB has periodicity P4, and the data strobe signal DQS has periodicity P5.

Figure 5:
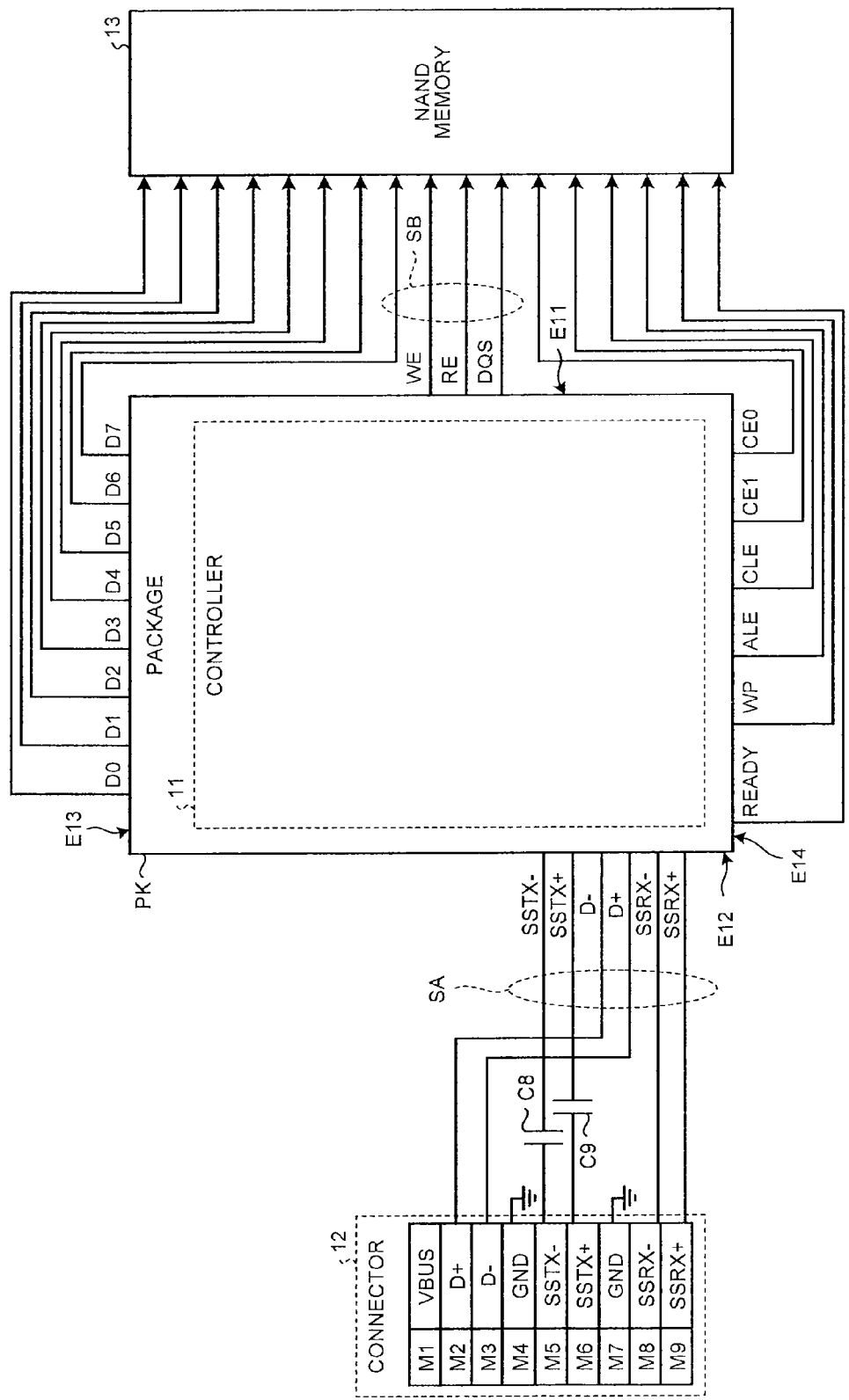
FIG. 5 is a block diagram illustrating a pin arrangement method of the memory device illustrated in FIG. 2.

FIG. 5 is a block diagram illustrating a pin arrangement method of the memory device illustrated in FIG. 2.

Referring to FIG. 5, a semiconductor chip with the USB controller 11 formed is resin-sealed in a QFP package PK, for example. In this example, the QFP package PK is provided with four ends E11 to E14. The NAND memory 13 is arranged on the end E11 side of the QFP package PK, and the connector 12 is arranged on the end E12 side of the same opposite to the end E11 side. The periodic control signal SB is sent from the end E11 side to the NAND memory 13. The interface signal SA can be communicated from the end E12 side to the connector 12. The data signals D0 to D7 can be communicated from the end E13 side to the NAND memory 13, for example. The chip enable signals CE0 and CE1, the command latch enable signal CLE, the address latch enable signal ALE, the write protect signal WP, and the ready signal READY can be sent from the end E14 side to the NAND memory 13.

In this example, by sending the periodic control signal SB from the end E11 side to the NAND memory 13, wire length for the control signal SB can be shortened. Accordingly, even when the data rate of 5 Gbps is to be supported under USB3.0 standards, for example, it is possible to suppress significant influence on the EMI (electro magnetic interference) because the wire for the control signal SB plays the role of an antenna.

The foregoing USB controller 11 is configured in conformity with the USB3.0 standards, but the present invention may be applied to a USB controller in conformity with USB2.0 standards.

(Third Embodiment)

Figure 6:
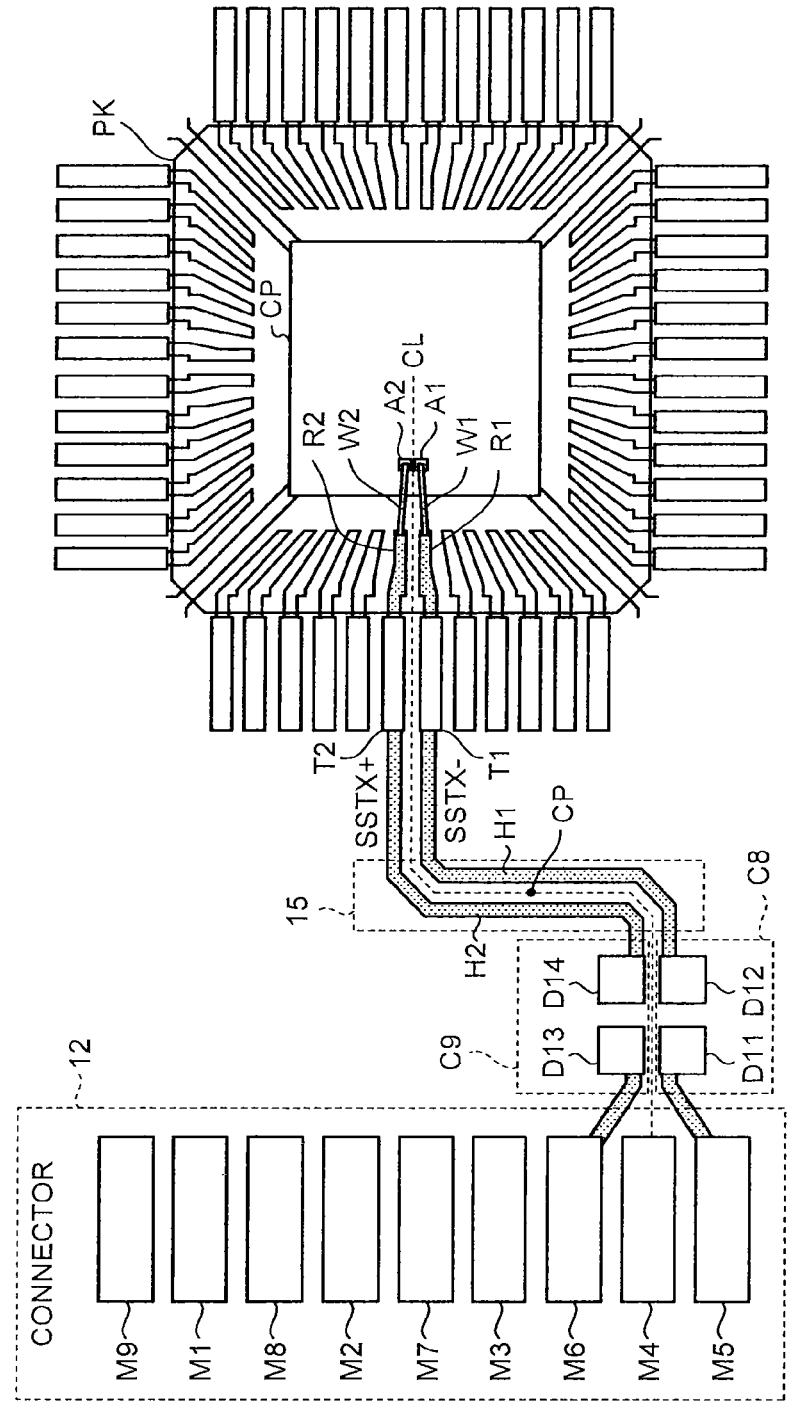
FIG. 6 is a schematic plane view of a memory device according to a third embodiment.

FIG. 6 is a schematic plane view of a memory device according to a third embodiment. In the third embodiment, a semiconductor chip CP is resin-sealed in the QFP package PK. FIG. 6 illustrates abstracted transmission paths of the differential transmission signals SSTX− and SSTX+ from the semiconductor chip CP to the connector 12.

Referring to FIG. 6, the USB controller 11 is formed on the semiconductor chip CP. The semiconductor chip CP is resin-sealed in the QFP package PK. The QFP package PK is provided with a pair of pads A1 and A2, a pair of bonding wires W1 and W2, a pair of lead terminals R1 and R2, and a pair of pins T1 and T2 corresponding to the differential transmission signals SSTX− and SSTX+. The capacity C8 is provided with pads D11 and D12, and the capacity C9 is provided with pads D13 and D14. A pair of wires H1 and H2 is provided between the QFP package PK and the connector 12 to connect the QFP package PK and the connector 12 via the capacities C8 and C9.

In this example, the pad A1, the bonding wire W1, the lead terminal R1, the pin T1, the pads D11 and D12, and the wire H1 can constitute a transmission path of the differential transmission signal SSTX− from the semiconductor chip CP to the connector 12. The pad A2, the bonding wire W2, the lead terminal R2, the pin T2, the pads D13 and D14, and the wire H2 can constitute a transmission path of the differential transmission signal SSTX+ from the semiconductor chip CP to the connector 12. The pair of transmission paths of the differential transmission signals SSTX− and SSTX+ from the semiconductor chip CP to the connector 12 can be arranged symmetrically. The symmetrical arrangement may be line-symmetric arrangement or point-symmetric arrangement for each of the constitutional elements of the transmission paths. The line-symmetric arrangement here refers to the state in which the constitutional elements of the pair of transmission paths are in mirror-image relationship with respect to one line. The point-symmetric arrangement here refers to the state in which the constitutional elements of the pair of transmission paths overlap by rotating one of the pair by 180° around one point. For example, the pads A1 and A2 may be line-symmetric with respect to a center line CL therebetween, or the bonding wires W1 and W2 may be line-symmetric with respect to the center line CL therebetween, the lead terminals R1 and R2 may be line-symmetric with respect to the center line CL therebetween, the pins T1 and T2 may be line-symmetric with respect to the center line CL therebetween, the wires H1 and H2 may be line-symmetric with respect to the center line CL therebetween, the pads D11 and D12 may be line-symmetric with respect to the center line CL therebetween, or the pads D13 and D14 may be line-symmetric with respect to the center line CL therebetween. When the wires H1 and H2 have bend sections, the bend sections of the wires H1 and H2 may be arranged such that the wires H1 and H2 within a region 15 including the bend sections are point-symmetric with respect to a rotation center CP. In this case, to arrange symmetrically the bonding wires W1 and W2 or the lead terminals R1 and R2, the pins T1 and P2 at the center of the QFP package PK are preferably assigned to the differential transmission signals SSTX− and SSTX+.

The pair of transmission paths of the differential transmission signals SSTX− and SSTX+ can be arranged adjacent to each other. The pair of transmission paths of the differential transmission signals SSTX− and SSTX+ can be equal in length from the semiconductor chip CP to the connector 12. In this case, the bonding wires W1 and W2 and the wires H1 and H2 are preferably equal in length. By arranging symmetrically the pair of transmission paths of the differential transmission signals SSTX− and SSTX+ from the semiconductor chip CP to the connector 12, it is possible to ensure pairing property of the differential transmission signals SSTX− and SSTX+. The pairing property of the differential transmission signals SSTX− and SSTX+ refers to the state in which the transmission paths of the differential transmission signals SSTX− and SSTX+ are arranged such that noises in the differential transmission signals SSTX− and SSTX+ are equalized and effectively canceled. Accordingly, it is possible to reduce skews in the differential transmission signals SSTX− and SSTX+ and reduce EMI noises in the differential transmission signals SSTX− and SSTX+. EMI noises in the differential transmission signals SSTX− and SSTX+ may affect the reception unit of a USB wireless mouse through the connector 12 so that the USB wireless mouse does not operate. Accordingly, by reducing the EMI noises in the differential transmission signals SSTX− and SSTX+, it is possible to suppress influence of the EMI in the USB memory device on the reception unit of the USB wireless mouse, and prevent that the USB wireless mouse does not operate.

By arranging the pair of transmission paths of the differential transmission signals SSTX− and SSTX+ adjacent to each other and equalizing the lengths of the pair of transmission paths of the differential transmission signals SSTX− and SSTX+ from the semiconductor chip CP to the connector 12, it is possible to equalize noises in the differential transmission signals SSTX− and SSTX+ and cancel the noises effectively.

In the example of FIG. 6, the semiconductor chip CP is resin-sealed in the QFP package PK. Instead of the QFP package PK, an LQFP package or a TQFP package may be used or a BGA may be used. Alternatively, the semiconductor chip CP may be COB-implemented.

The example of FIG. 6 is configured in line symmetry or point symmetry. Alternatively, the present invention may be configured in a manner equivalent to line symmetry or point symmetry within the scope of maintaining the pairing property of the pair of transmission paths of the differential transmission signals SSTX− and SSTX+.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
a non-volatile memory chip;
a memory controller chip that controls the non-volatile memory;
a connector that connects the memory controller chip to a host;
a substrate on which the non-volatile memory chip and the memory controller chip are mounted; and
a package sealing the memory controller chip with resin, the package being mounted on the substrate, wherein
the memory controller chip comprises two pads,
the memory controller chip is capable of interactive communications with the host by using a differential transmission signal and a differential reception signal, and
a pair of transmission paths of the differential transmission signal is arranged symmetrically from pads to the connector, the transmission paths including wires, and the substrate has the wires.

2. The memory device according to claim 1, wherein the transmission paths are arranged adjacent to each other.

3. The memory device according to claim 1, wherein the transmission paths are equal in length from the pads to the connector.

4. The memory device according to claim 1, wherein the transmission paths are ensured in pairing property from the pads to the connector.

5. The memory device according to claim 1, wherein
the non-volatile memory chip is arranged on a first end side of the package, and
the connector is arranged on a second end side opposite to first end side.

6. The memory device according to claim 4, wherein the transmission paths include a bonding wire, a lead terminal, and a pin in the package.

7. The memory device according to claim 1, wherein a terminal in the package for the differential transmission signal and the differential reception signal is arranged on the second end side.

8. The memory device according to claim 1, wherein the non-volatile memory chip is an NAND memory chip.

9. The memory device according to claim 8, wherein the memory controller chip is a USB controller chip.

10. The memory device according to claim 5, wherein the package is a QFP package.

* * * * *